(12) United States Patent
Takeuchi et al.

(10) Patent No.: US 6,525,448 B1
(45) Date of Patent: Feb. 25, 2003

(54) PIEZOELECTRIC/ELECTROSTRICTIVE DEVICE

(76) Inventors: Yukihisa Takeuchi, c/o NGK Insulators, Ltd. 2-56, Suda-Cho, Mizuho-Ku, Nagoya-City, Aichi-Prefecture 467-8530 (JP); Kazuyoshi Shibata, c/o NGK Insulators, Ltd. 2-56, Suda-Cho, Mizuho-Ku, Nagoya-City, Aichi-Prefecture 467-8530 (JP)

( * ) Notice: Subject to any disclaimer, the term of this patent is extended or adjusted under 35 U.S.C. 154(b) by 0 days.

(21) Appl. No.: 09/661,881

(22) Filed: Sep. 14, 2000

Related U.S. Application Data (63) Continuation-in-part of application No. 09/524,042, filed on Mar. 13, 2000.
(60) Provisional application No. 60/210,263, filed on Jun. 8, 2000.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |
| Jun. 6, 2000 | (JP) | 2000-169504 |

(51) Int. Cl.$^7$ .............................................. H01L 41/08
(52) U.S. Cl. ........................................ 310/328; 310/331
(58) Field of Search .............................. 310/321, 328, 310/330, 331

(56) References Cited

U.S. PATENT DOCUMENTS

| 3,146,367 A | * | 8/1964 | McNaney | 310/331 |
| 4,523,120 A | * | 6/1985 | Assard et al. | 310/317 |
| 4,612,440 A | * | 9/1986 | Brunnee et al. | 250/281 |
| 4,742,260 A | * | 5/1988 | Shimizu et al. | 310/323.16 |
| 5,049,775 A | * | 9/1991 | Smits | 310/328 |

(List continued on next page.)

FOREIGN PATENT DOCUMENTS

| EP | 1 017 116 A2 | 7/2000 | H01L/41/09 |
| EP | 1 089 351 A2 | 4/2001 | H01L/41/08 |
| EP | 1 089 352 A2 | 4/2001 | 310/328 |
| EP | 1 089 356 A2 | 4/2001 | H01L/41/09 |
| EP | 1 089 358 A2 | 4/2001 | H01L/41/09 |

(List continued on next page.)

OTHER PUBLICATIONS

U.S. patent application Ser. No. 09/642,861, Takeuchi et al., filed Aug. 21, 2000.
U.S. patent application Ser. No. 09/643,163, Takeuchi et al., filed Aug. 21, 2000.
U.S. patent application Ser. No. 09/671,669, Takeuchi et al., filed Sep. 27, 2000.
U.S. patent application Ser. No. 09/676,209, Takeuchi et al., filed Sep. 29, 2000.

(List continued on next page.)

*Primary Examiner*—Thomas M. Dougherty
(74) *Attorney, Agent, or Firm*—Burr & Brown (57) ABSTRACT

A piezoelectric/electrostrictive device includes a pair of mutually opposing thin plate sections and a fixation section for supporting the thin plate sections. The thin plate and fixation sections are formed from ceramics in an integrated manner. An object is attached between forward end portions of the pair of thin plate sections. Piezoelectric/electrostrictive elements are arranged on respective side surfaces of the pair of thin plate sections. An areal size of a surface of the object opposed to the thin plate sections is larger than an areal size of an object attachment surface of the thin plate sections.

6 Claims, 7 Drawing Sheets

U.S. PATENT DOCUMENTS

| | | | |
|---|---|---|---|
| 5,063,321 A | | 11/1991 | Carter .................... 310/323.01 |
| 5,173,605 A | * | 12/1992 | Hayes et al. ................. 250/306 |
| 5,500,777 A | * | 3/1996 | Hasegawa et al. .......... 310/317 |
| 5,691,594 A | | 11/1997 | Takeuchi et al. ............ 310/330 |
| 5,693,997 A | | 12/1997 | Griffith et al. ............... 310/328 |
| 5,745,319 A | | 4/1998 | Takekado et al. ........ 360/78.05 |
| 5,747,915 A | | 5/1998 | Benavides ................. 310/331 |
| 5,912,524 A | | 6/1999 | Ohnishi et al. ............. 310/321 |
| 5,969,248 A | | 10/1999 | Kurachi et al. .......... 73/504.12 |
| 6,049,158 A | | 4/2000 | Takeuchi et al. ............ 310/328 |
| 6,109,104 A | | 8/2000 | Fukuda et al. ........... 73/504.13 |
| 6,140,739 A | | 10/2000 | Arai et al. .................. 310/321 |
| 6,246,552 B1 | | 6/2001 | Soeno et al. ................ 360/294 |
| 6,262,516 B1 | | 7/2001 | Fukuda et al. .............. 310/328 |

FOREIGN PATENT DOCUMENTS

| | | | |
|---|---|---|---|
| JP | 63-64640 | 3/1988 | ............ G11B/7/09 |
| JP | 02-119278 | 5/1990 | ............ H01L/41/09 |
| JP | 10-136665 | 5/1998 | ............ H02N/2/00 |
| JP | 11-51959 | 2/1999 | ........... G01P/15/09 |
| WO | 01/26166 A1 | 4/2001 | ........... H01L/41/08 |
| WO | 01/26169 A1 | 4/2001 | ........... H01L/41/08 |

OTHER PUBLICATIONS

U.S. patent application Ser. No. 09/677,304, Takeuchi et al., filed Sep. 29, 2000.

U.S. patent application Ser. No. 09/878,773, Ikeda et al., filed Jun. 11, 2001.

U.S. patent application Ser. No. 10/046,331, Ikeda et al., filed Jan. 14, 2002.

Yoshikazu Soeno, et al., *"Piezoelectric Piggy–Back Microactuator for Hard Disk Drive,"* IEEE Transactions on Magnetics, vol. 35, No. 2, Mar. 1999, pp. 983–987.

S. Koganezawa, et al., *"Dual–Stage Actuator System for Magnetic Disk Drives Using a Shear Mode Piezoelectric Microactuator,"* IEEE Transactions on Magnetics, vol. 35, No. 2, Mar. 1999, pp. 998–992.

* cited by examiner

PIEZOELECTRIC/ELECTROSTRICTIVE DEVICE

This application is a continuation-in-part of Ser. No. 09/524,042 Mar. 13, 2000 and claims benefit of No. 60/210,263 Jun. 8, 2000.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element.

2. Description of the Related Art

Recently, a displacement element, which makes it possible to adjust the optical path length and the position in an order of submicron, is required, for example, in the fields of the optics, the magnetic recording, and the precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

Figure 7:
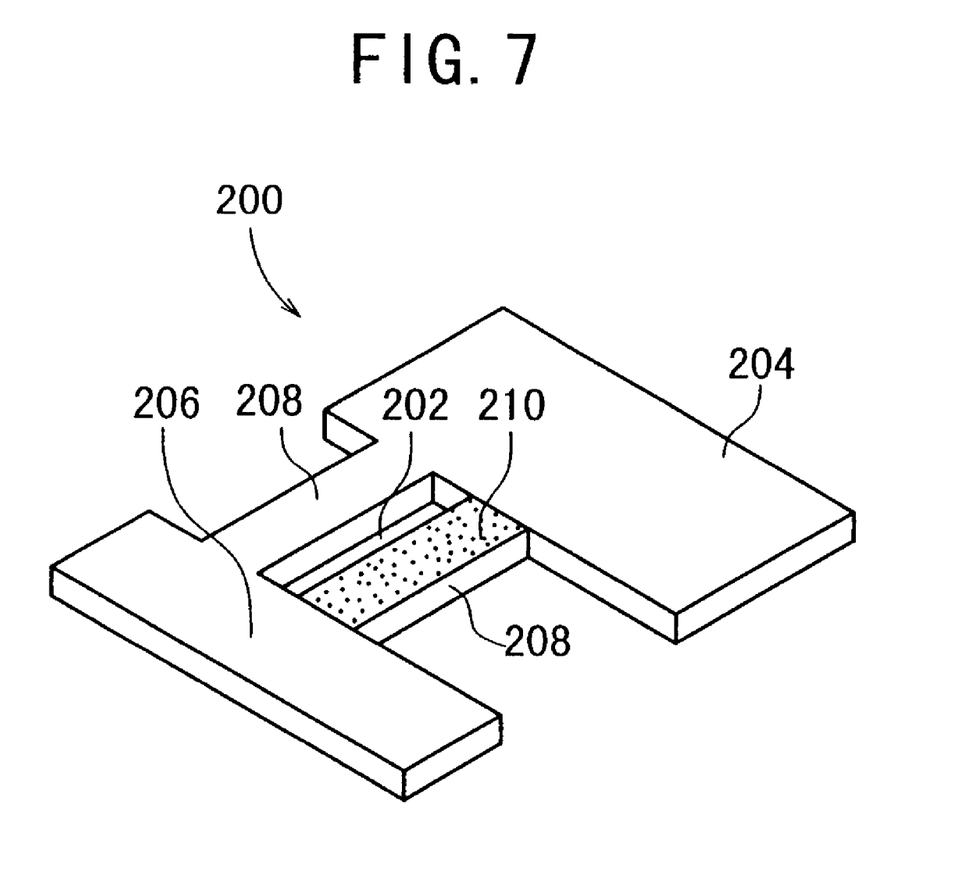
FIG. 7 shows an arrangement of a piezoelectric/electrostrictive device concerning an illustrative conventional technique.

As shown in FIG. 7, for example, those hitherto disclosed as such a displacement element include a piezoelectric actuator comprising a fixation section 204, a movable section 206, and a beam section 208 for supporting them which are formed in an integrated manner with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixation section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this technique, electrodes for the bimorph are provided in a divided manner. The actuator is driven due to the selection of the divided electrodes, and thus the highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section 206 is small, because the displacement in the direction of expansion and contraction of the piezoelectric/electrostrictive material (i.e., in the in-plane direction of the plate-shaped member 200) is transmitted to the movable section 206 as it is.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance.

Further, the piezoelectric actuator itself is heavy, and its operation tends to be affected by harmful vibrations (for example, residual vibration and noise vibration during high speed operation).

In order to solve the problems described above, it has been suggested that the hole 202 is filled with a filler material having flexibility. However, it is clear that the amount of displacement, which is brought about by the inverse piezoelectric effect or the electrostrictive effect, is decreased even when the filler material is merely used.

SUMMARY OF THE INVENTION

The present invention has been made taking the foregoing problems into consideration, an object of which is to provide a piezoelectric/electrostrictive device which makes it possible to miniaturize the device and which is scarcely affected by harmful vibration and capable of high speed response with high mechanical strength while being excellent in handling performance, shock resistance, and moisture resistance.

According to the present invention, there is provided a piezoelectric/electrostrictive device comprising a pair of mutually opposing thin plate sections and a fixation section for supporting the thin plate sections, which are formed with ceramics in an integrated manner; an object attached between forward end portions of the pair of thin plate sections; and one or more piezoelectric/electrostrictive elements arranged on at least one thin plate section of the pair of thin plate sections; wherein an areal size of a surface of the object opposed to the thin plate section is larger than an areal size of an object attachment surface of the thin plate section.

Accordingly, the object is attached in such a form that the object is interposed between the pair of thin plate sections. Therefore, it is possible to effectively suppress the increase in size, which would be otherwise caused when the object is attached. The pair of thin plate sections and the fixation section are formed of ceramics in an integrated manner. Therefore, the device is scarcely affected by harmful vibration, and it is capable of high speed response with high mechanical strength while being excellent in handling performance, shock resistance, and moisture resistance.

It is also preferable that the piezoelectric/electrostrictive element has a film-shaped configuration, and it is integrated with the thin plate section by means of sintering. It is also preferable that the object is secured to the object attachment surface of the thin plate section by the aid of an adhesive. In this arrangement, the adhesive may be organic resin, or it may be glass, braze, or solder.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Explanation will be made below with reference to FIGS. 1 to 6 for illustrative embodiments of the piezoelectric/electrostrictive device according to the present invention.

Figure 1:
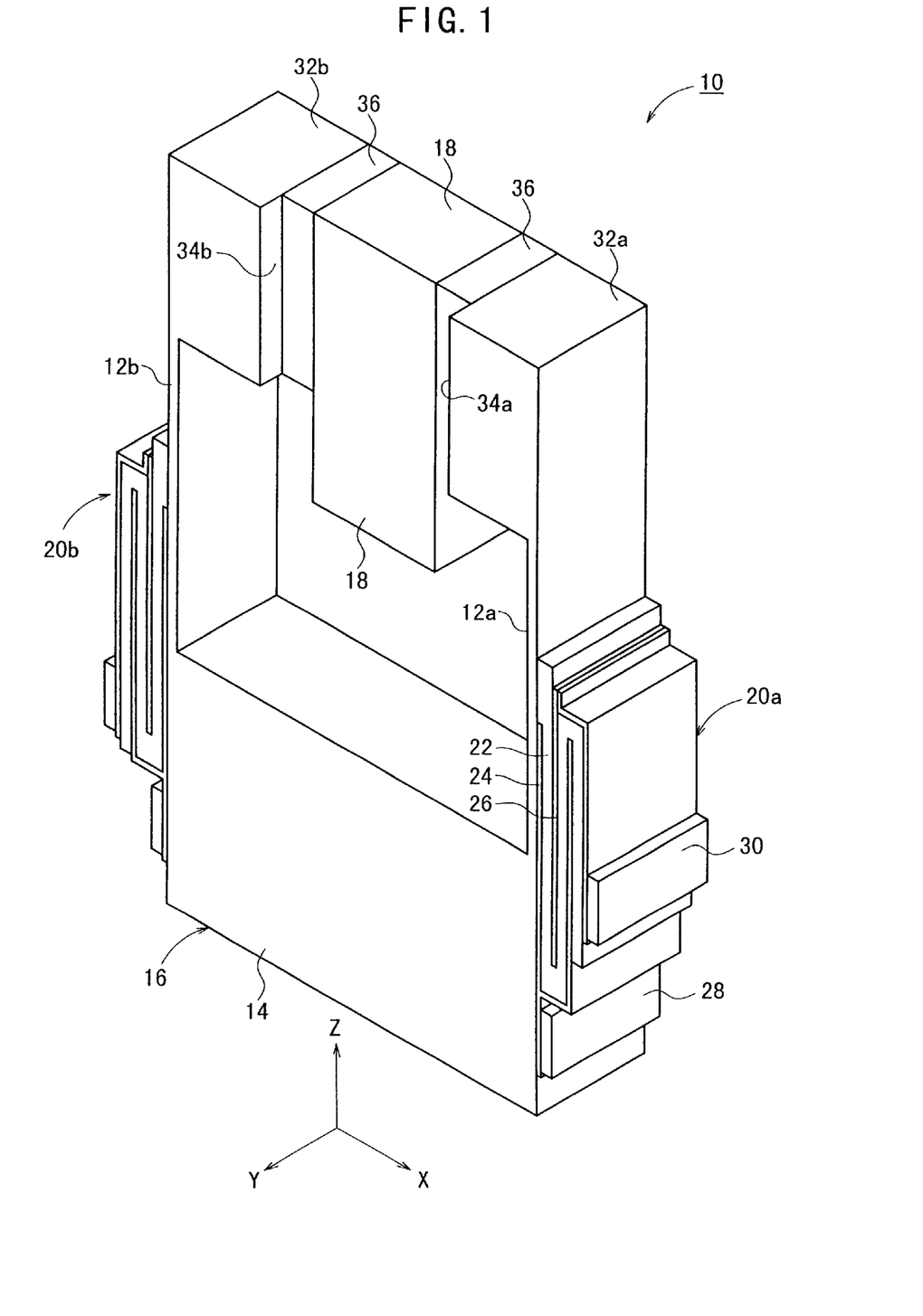
FIG. 1 shows a perspective view illustrating an arrangement of a piezoelectric/electrostrictive device according to an embodiment of the present invention.

As shown in FIG. 1, the piezoelectric/electrostrictive device 10 according to this embodiment comprises a ceramic substrate 16 including a pair of mutually opposing thin plate sections 12a, 12b and a fixation section 14 for supporting the thin plate sections 12a, 12b, which are formed integrally with ceramics, and an object 18 which is allowed to intervene between forward end portions of the pair of thin plate sections 12a, 12b. The piezoelectric/electrostrictive device 10 further comprises piezoelectric/electrostrictive elements 20a, 20b which are arranged on outer surfaces (hereinafter referred to as "side surfaces") of the pair of thin plate sections 12a, 12b respectively. The piezoelectric/electrostrictive device 10 is operated such that the object is displaced in accordance with the driving of the piezoelectric/electrostrictive element or elements 20a and/or 20b.

The time-dependent change of state scarcely occurs in the integrated product of ceramics as described above, because no adhesive exists at joined portions between the respective parts. Therefore, the reliability of the joined portion is high, giving a structure which is advantageous to ensure the rigidity. Additionally, the integrated product of ceramics can be produced with ease by means of the method for laminating ceramic green sheets as described later on.

The piezoelectric/electrostrictive elements 20a, 20b are prepared as separate members, and the prepared piezoelectric/electrostrictive elements 20a, 20b are stuck to the ceramic substrate 16 with an adhesive such as organic resin or glass or by means of, for example, brazing, soldering, or eutectic bonding. Alternatively, the piezoelectric/electrostrictive elements 20a, 20b are directly formed on the side surfaces of the thin plate sections 12a, 12b by using the film formation method not by using the sticking method described above.

The piezoelectric/electrostrictive element 20a, 20b comprises a piezoelectric/electrostrictive layer 22, and a pair of electrodes 24, 26 which are formed on both sides of the piezoelectric/electrostrictive layer 22. The first electrode 24 of the pair of electrodes 24, 26 is formed at least on each of the pair of thin plate sections 12a, 12b.

In the embodiment of the present invention, each of the piezoelectric/electrostrictive layer 22 and the pair of electrodes 24, 26 has a multilayered structure, and the first electrode 24 and the second electrode 26 are alternately stacked with each other to give a substantially comb-shaped cross section to provide the piezoelectric/electrostrictive element 20a, 20b which has a multiple stage structure at a portion at which the first electrode 24 and the second electrode 26 are overlapped with each other with the piezoelectric/electrostrictive layer 22 interposed therebetween.

FIG. 1 is illustrative of a case in which the piezoelectric/electrostrictive layer 22 has a three-layered structure, the first electrode 24 is formed to have a comb-shaped configuration to be located at the lower surface of the first layer (side surface of the thin plate section 12a, 12b) and at the upper surface of the second layer, and the second electrode 26 is formed to have a comb-shaped configuration to be located at the upper surface of the first layer and at the upper surface of the third layer. In the case of this arrangement, the number of terminals 28, 30 can be decreased by mutually connecting the first electrodes 24 and the second electrodes 26 respectively to be common. Therefore, the increase in size, which would be otherwise caused by the multilayered structure of the piezoelectric/electrostrictive element 20a, 20b, can be suppressed.

Respective forward end portions of the pair of thin plate sections 12a, 12b are thick-walled toward the inside. Mutually opposing surfaces 34a, 34b of the respective thick-walled sections 32a, 32b function as object attachment surfaces for attaching the object 18.

On the other hand, the object 18 has a size of such a degree that it is accommodated between the respective thick-walled sections 32a, 32b of the pair of thin plate sections 12a, 12b, and it has a substantially rectangular parallelepiped-shaped configuration (of course, there is no limitation to the rectangular parallelepiped). The areal size of the side surface of the object 18 (surface opposed to the thick-walled section 32a, 32b of the thin plate section 12a, 12b) is designed to be larger than the areal size of the object attachment surface 34a, 34b of the thin plate section 12a, 12b. In FIG. 1, the following positional relationship is given. That is, the forward end surface of the object 18 is approximately coincident with the forward end surface of each of the thin plate sections 12a, 12b. The rearward end surface (surface opposed to the fixation section 14) of the object 18 protrudes toward the fixation section 14 with respect to the thick-walled sections 32a, 32b of the thin plate sections 12a, 12b. The object 18 is secured to the object attachment surfaces 34a, 34b of the thin plate sections 12a, 12b by the aid of an adhesive 36.

In the piezoelectric/electrostrictive device 10 according to the embodiment described above, as shown in FIG. 4, for example, it is preferable that distances La, Lb from the central axis n of the object 18 to the respective object attachment surfaces 34a, 34b are approximately identical to one another.

The voltage is applied to the pair of electrodes 24, 26 via terminals (pads) 28, 30 of the respective electrodes 24, 26 formed on the both side surfaces (element formation surfaces) of the fixation section 14 respectively. The respective terminals 28, 30 are positioned as follows. That is, the terminal 28 corresponding to the first electrode 24 is formed at the position deviated toward the rearward end of the fixation section 14. The terminal 30 corresponding to the second electrode 26 disposed on the side of the external space is formed at the position deviated toward the inner wall of the fixation section 14.

In this embodiment, the piezoelectric/electrostrictive device 10 can be individually fixed by utilizing the surfaces respectively different from the surfaces on which the terminals 28, 30 are arranged. As a result, it is possible to obtain the high reliability for both of the fixation of the piezoelectric/electrostrictive device 10 and the electric connection between the circuit and the terminals 28, 30. In this arrangement, the electric connection between the terminals 28, 30 and the circuit is made, for example, by means of the flexible printed circuit (also referred to as FPC), the flexible flat cable (also referred to as FFC), and the wire bonding.

Figure 2:
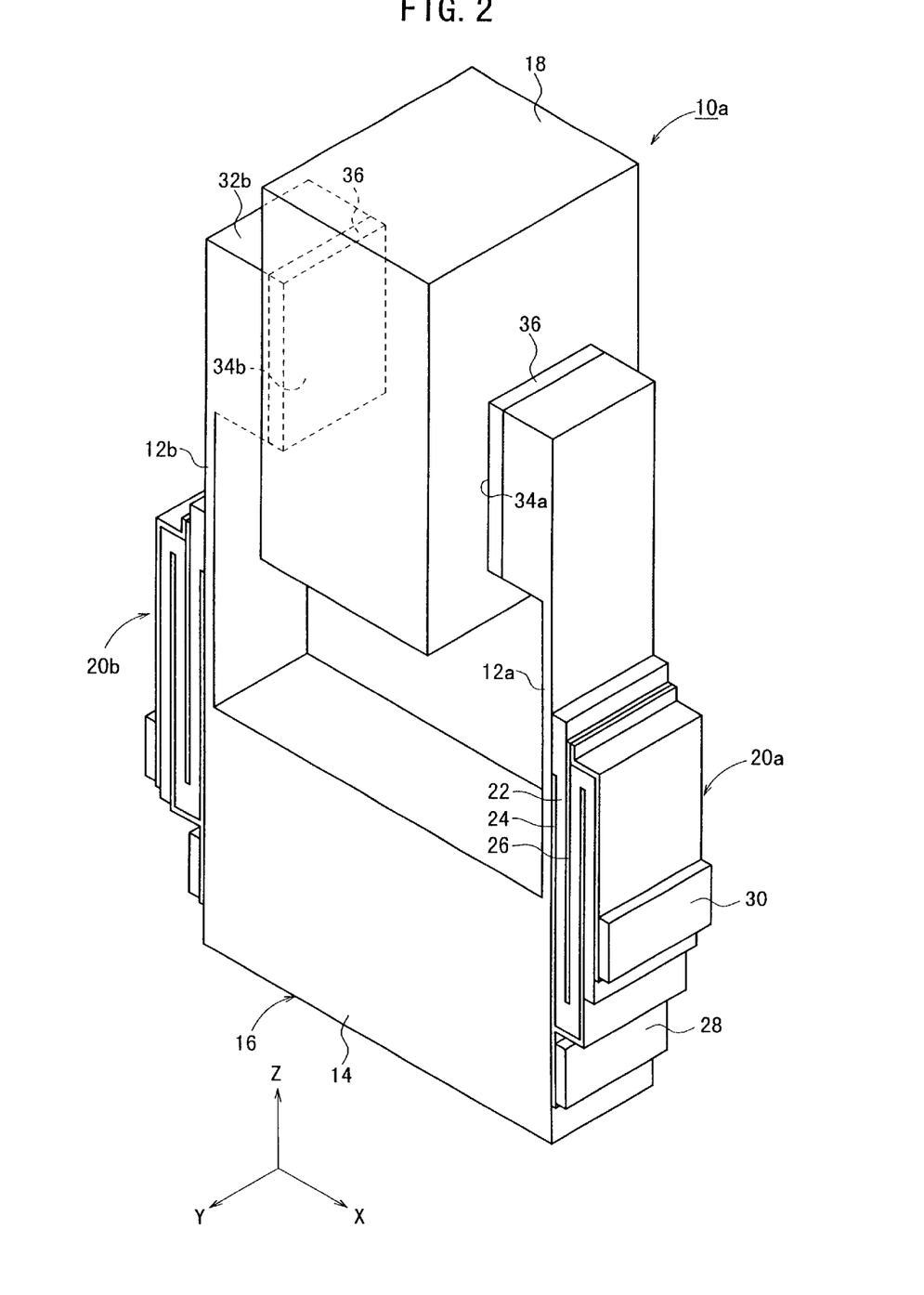
FIG. 2 shows a perspective view illustrating a first modified embodiment of the piezoelectric/electrostrictive element according to the embodiment of the present invention.

Arrangements other than the arrangement shown in FIG. 1 are available to construct the piezoelectric/electrostrictive device 10 according to the embodiment of the present invention. That is, as in a piezoelectric/electrostrictive device 10a according to a first modified embodiment shown in FIG. 2, the size of the object 18 may be further increased. The embodiment shown in FIG. 2 is illustrative of a case in which the size of the side surface of the object 18 is made larger than the size of the object attachment surface 34a, 34b in the vertical direction and in the lateral direction.

Figure 3:
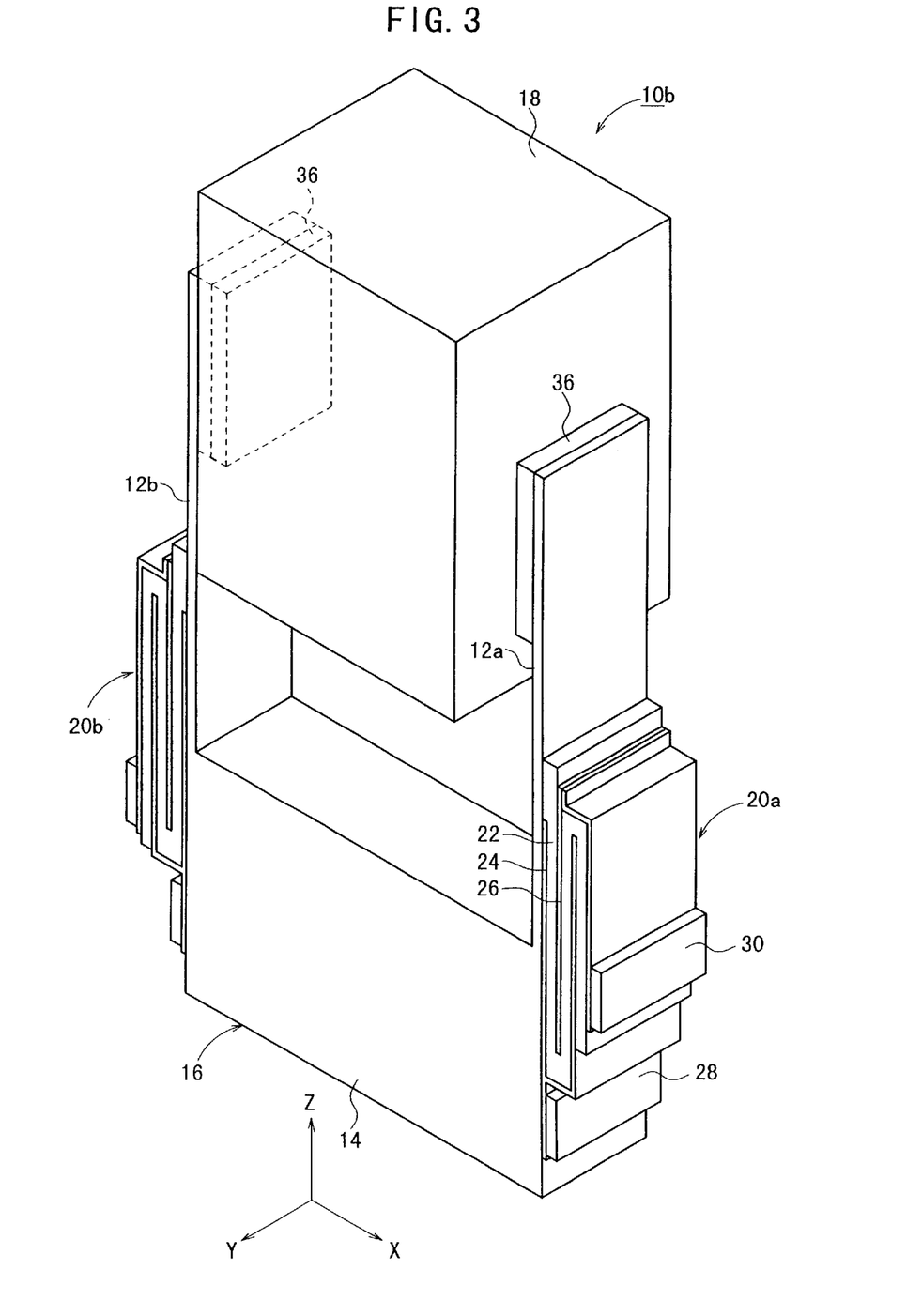
FIG. 3 shows a perspective view illustrating a second modified embodiment of the piezoelectric/electrostrictive element according to the embodiment of the present invention.

Further, as in a piezoelectric/electrostrictive device 10b according to a second modified embodiment shown in FIG. 3, the whole of the thin plate section 12a, 12b may have an identical thickness, without providing the thick-walled section 32a, 32b at the forward end portion of the thin plate section 12a, 12b. In this case, it is possible attach the object 18 having a larger size.

In the embodiment of the present invention, the piezoelectric/electrostrictive element 20a, 20b is allowed to have the multiple stage structure. Therefore, the generated force of the piezoelectric/electrostrictive element 20a, 20b is increased, and thus it is possible to contemplate the large displacement. Further, the rigidity of the piezoelectric/electrostrictive device 10 itself is increased, and thus it is possible to realize the high resonance frequency, making it easy to achieve the realization of a high speed of the displacement action.

When the number of stages is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10 according to this embodiment, even when the driving force is increased by providing the multistage structure of the piezoelectric/electrostrictive element 20a, 20b, the width of the thin plate section 12a, 12b (distance in the Y axis direction) is basically unchanged. Therefore, the device is extremely preferred to make application, for example, to the actuator for the purpose of the ringing control and the positioning of the magnetic head for the hard disk to be used in an extremely narrow gap.

Figure 4:
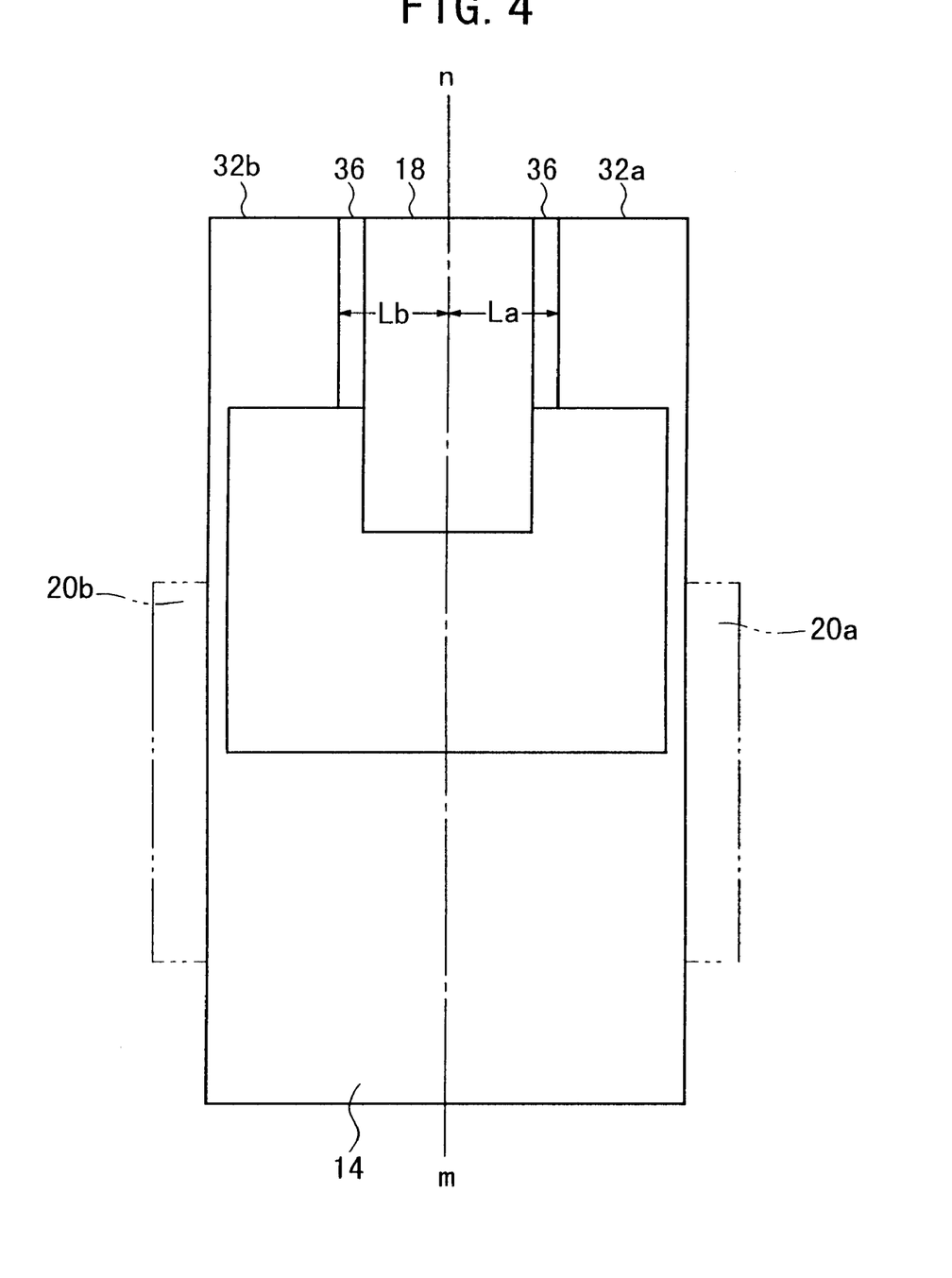
FIG. 4 illustrates a situation in which both of the piezoelectric/electrostrictive elements do not make the displacement action in the piezoelectric/electrostrictive device according to the embodiment of the present invention.

The operation of the piezoelectric/electrostrictive device 10 according to the embodiment of the present invention will now be explained. At first, for example, when the two piezoelectric/electrostrictive elements 20a, 20b are in the natural state, namely when both of the piezoelectric/electrostrictive elements 20a, 20b do not make the displacement action, then the major axis m of the piezoelectric/electrostrictive device 10 (major axis of the fixation section) is substantially coincident with the central axis n of the object 18 as shown in FIG. 4.

Figure 5A:
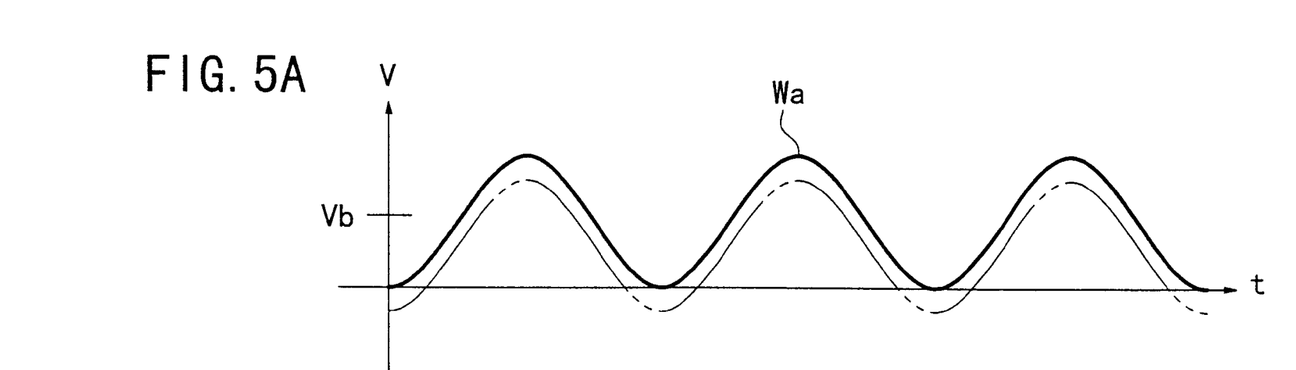
FIG. 5A shows a waveform illustrating a voltage waveform to be applied to the first piezoelectric/electrostrictive element.
Figure 5B:
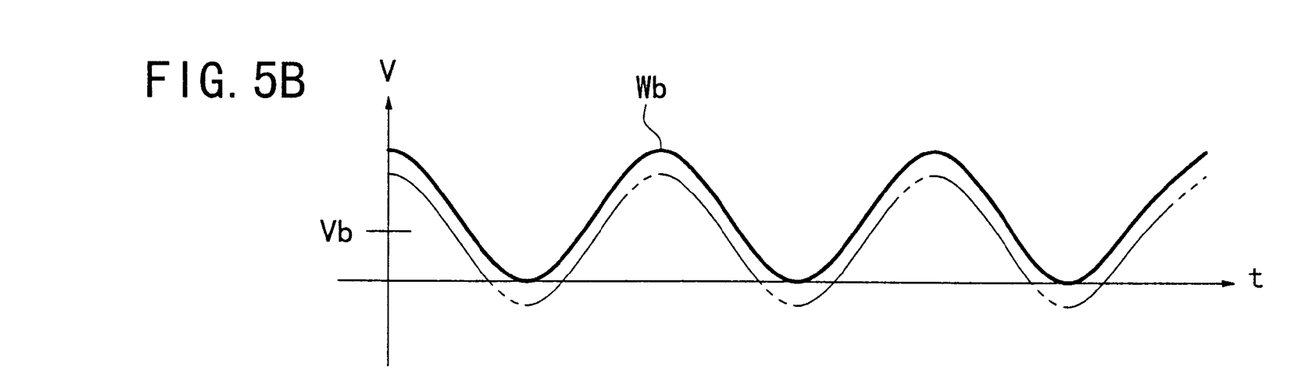
FIG. 5B shows a waveform illustrating a voltage waveform to be applied to the second piezoelectric/electrostrictive element.

Starting from this state, for example, a sine wave Wa, which has a predetermined bias electric potential Vb, is applied to the pair of electrodes 24, 26 of the first piezoelectric/electrostrictive element 20a as shown in a waveform figure shown in FIG. 5A, while a sine wave Wb, which has a phase different from that of the sine wave Wa by about 180°, is applied to the pair of electrodes 24, 26 of the second piezoelectric/electrostrictive element 20b as shown in FIG. 5B.

Figure 6:
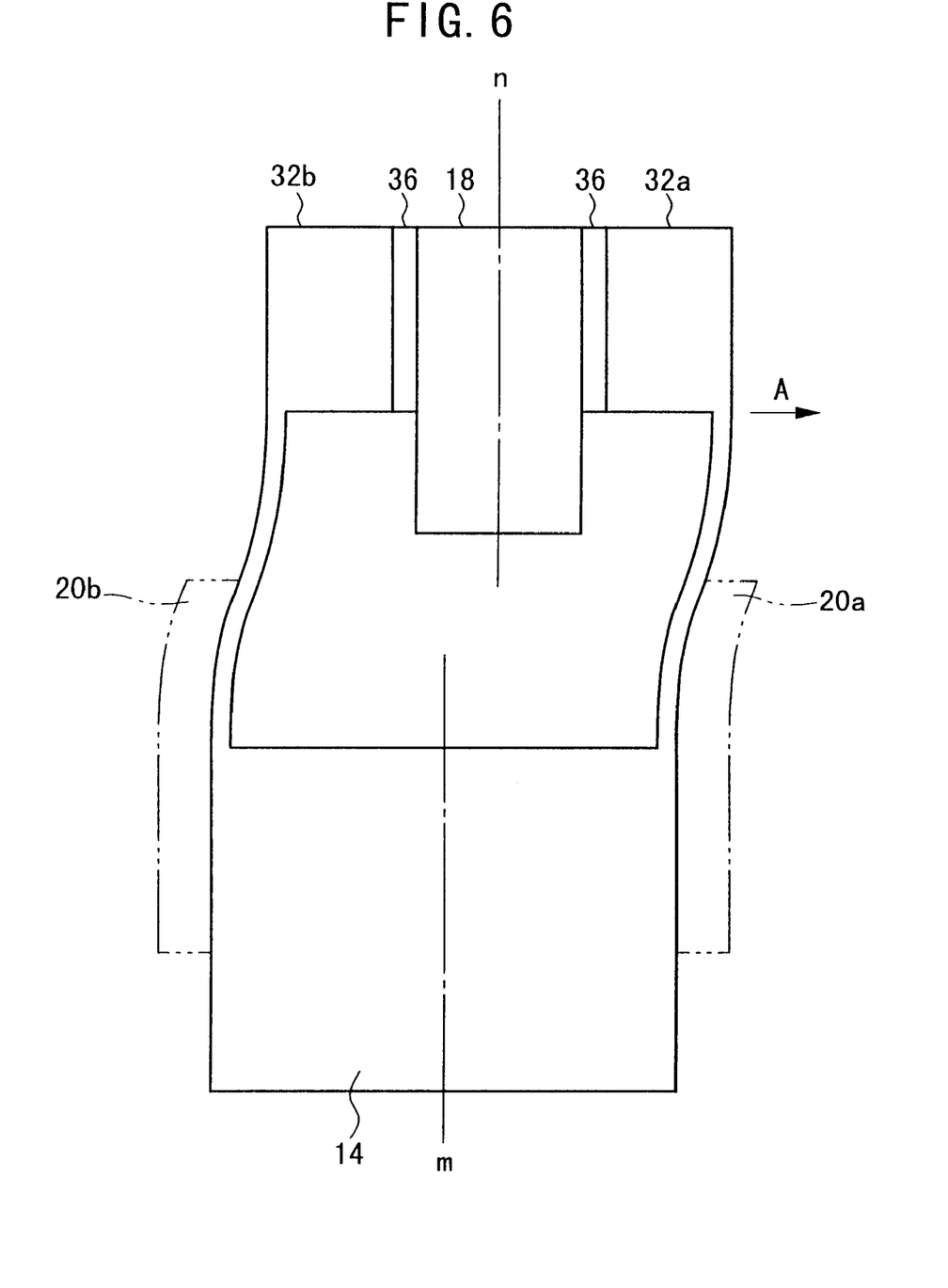
FIG. 6 illustrates a situation in which the piezoelectric/electrostrictive element makes the displacement action in the piezoelectric/electrostrictive device according to the embodiment of the present invention.

The piezoelectric/electrostrictive layer 22 of the first piezoelectric/electrostrictive element 20a makes the contraction displacement in the direction of the first principal surface at a stage at which, for example, a voltage having a maximum value is applied to the pair of electrodes 24, 26 of the first piezoelectric/electrostrictive element 20a. Accordingly, as shown in FIG. 6, for example, the stress is generated for the first thin plate section 12a to bend the thin plate section 12a, for example, in the rightward direction as shown by the arrow A. Therefore, the first thin plate section 12a is bent in the rightward direction. At this time, a state is given, in which no voltage is applied to the pair of electrodes 24, 26 of the second piezoelectric/electrostrictive element 20b. Therefore, the second thin plate section 12b follows the bending of the first thin plate section 12a, and it is bent in the rightward direction. As a result, the object 18 is displaced, for example, in the rightward direction with respect to the major axis m of the piezoelectric/electrostrictive device 10. The displacement amount is changed depending on the maximum value of the voltage applied to each of the piezoelectric/electrostrictive elements 20a, 20b. For example, the larger the maximum value is, the larger the displacement amount is.

Especially, when a piezoelectric/electrostrictive material having a high coercive electric field is applied as the constitutive material for the piezoelectric/electrostrictive layer 22, it is also preferable that the bias electric potential is adjusted so that the level of the minimum value is a slightly negative level as depicted by waveforms indicated by dashed lines in FIGS. 5A and 5B. In this case, for example, the stress, which is in the same direction as the bending direction of the first thin plate section 12a, is generated in the second thin plate section 12b by driving the piezoelectric/electrostrictive element (for example, the second piezoelectric/electrostrictive element 20b) to which the negative level is applied. Accordingly, it is possible to further increase the displacement amount of the object 18. In other words, when the waveforms indicated by the dashed lines in FIGS. 5A and 5B are used, the device is allowed to have such a function that the piezoelectric/electrostrictive element 20b or 20a, to which the negative level is applied, supports the piezoelectric/electrostrictive element 20a or 20b which principally makes the displacement action.

As described above, in the piezoelectric/electrostrictive device 10 according to the embodiment of the present invention, the minute displacement of the piezoelectric/electrostrictive element 20a, 20b is amplified into the large displacement action by utilizing the bending of the thin plate section 12a, 12b, and it is transmitted to the object 18. Accordingly, it is possible to greatly displace the object 18 with respect to the major axis m of the piezoelectric/electrostrictive device 10.

Especially, in the embodiment of the present invention, the object 18 is attached in such a form that the object 18 is interposed between the pair of thin plate sections 12a, 12b. Therefore, it is possible to effectively suppress the increase in size, especially the increase in size in the Y axis direction, which would be otherwise caused when the object 18 is attached. Further, in the embodiment of the present invention, the pair of thin plate sections 12a, 12b and the fixation section 14 are formed of ceramics in an integrated manner. Therefore, the device is scarcely affected by harmful vibration, and it is capable of high speed response with high mechanical strength while being excellent in handling performance, shock resistance, and moisture resistance.

In the embodiment of the present invention, the piezoelectric/electrostrictive element 20*a*, 20*b* is constructed to have the piezoelectric/electrostrictive layer 22 and the pair of electrodes 24, 26 which are formed on the both sides of the piezoelectric/electrostrictive layer 22. The first electrode 24 of the pair of electrodes 24, 26 is formed directly on at least the side surface of the thin plate section 12*a*, 12*b*. Accordingly, the vibration, which is caused by the piezoelectric/electrostrictive element 20*a*, 20*b*, can be efficiently transmitted to the object 18 via the thin plate section 12*a*, 12*b*. Thus, it is possible to improve the response performance.

In the embodiment of the present invention, the portion (substantial driving portion), at which the pair of electrodes 24, 26 are overlapped with each other with the piezoelectric/electrostrictive layer 22 interposed therebetween, is formed continuously to be included in a range from a part of the fixation section 14 to a part of the thin plate section 12*a*, 12*b*. Therefore, it is possible to avoid the inconvenience of the restriction of the displacement action of the object 18. It is possible to increase the displacement amount of the object 18.

The actual size of each of the components is determined considering, for example, the areal size of the object attachment surface 34*a*, 34*b* of the thin plate section 12*a*, 12*b*, the joining area for attaching the fixation section 14 to another member, the joining area for attaching the electrode terminal or the like, and the strength, the durability, the necessary displacement amount, the resonance frequency, and the driving voltage of the entire piezoelectric/electrostrictive device 10.

In the piezoelectric/electrostrictive device 10, the shape of the device 10 is not the plate-shaped configuration (the thickness in the direction perpendicular to the displacement direction is small) unlike conventional one. Each of the object 18 and the fixation section 14 has the rectangular parallelepiped-shaped configuration (the thickness in the direction perpendicular to the displacement direction is large). The pair of thin plate sections 12*a*, 12*b* are provided so that the side surface of the object 18 is continuous to the side surface of the fixation section 14. Therefore, it is possible to selectively increase the rigidity of piezoelectric/electrostrictive device 10 in the Y axis direction.

That is, in the piezoelectric/electrostrictive device 10, it is possible to selectively generate only the operation of the object 18 in the plane (XZ plane). It is possible to suppress the operation of the object in the YZ plane (operation in the so-called flapping direction).

Next, explanation will be made for the respective constitutive components of the piezoelectric/electrostrictive device 10 according to this embodiment.

A variety of members may be attached as the object 18 depending on the purpose of use of the piezoelectric/electrostrictive device 10. For example, when the piezoelectric/electrostrictive device 10 is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixation section 14 is the portion for supporting the thin plate sections 12*a*, 12*b*. For example, when the fixation section 14 is utilized to position the magnetic head of the hard disk drive, the entire piezoelectric/electrostrictive device 10 is fixed by supporting and securing the fixation section 14, for example, to a carriage arm attached to VCM (voice coil motor) or a fixation plate or a suspension attached to the carriage arm. As shown in FIG. 1, the terminals 28, 30 for driving the piezoelectric/electrostrictive elements 20*a*, 20*b* and other members are arranged on the fixation section 14 in some cases.

The material for constructing the fixation section 14 is not specifically limited provided that it has rigidity. However, it is possible to preferably use ceramics to which the ceramic green sheet-laminating method is applicable as described later on. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of them. However, in view of the high mechanical strength and the high toughness, it is preferable to use a material containing a major component of zirconia, especially fully stabilized zirconia and a material containing a major component of partially stabilized zirconia.

As described above, the thin plate section 12*a*, 12*b* is the portion which is driven in accordance with the displacement of the piezoelectric/electrostrictive element 20*a*, 20*b*. The thin plate section 12*a*, 12*b* is the thin plate-shaped member having flexibility, and it functions to amplify the expansion and contracting displacement of the piezoelectric/electrostrictive element 20*a*, 20*b* arranged on the surface as the bending displacement and transmit the displacement to the object 18. Therefore, it is enough that the shape or the material of the thin plate section 12*a*, 12*b* provides the flexibility with the mechanical strength of such a degree that it is not broken by the bending displacement. It is possible to make appropriate selection considering the response performance and the operability of the object 18.

Ceramics, which is similarly used for the fixation section 14, can be preferably used as the material for constructing the thin plate section 12*a*, 12*b*. A material containing a major component of zirconia, especially fully stabilized zirconia and a material containing a major component of partially stabilized zirconia are most preferably used, because the mechanical strength is large even in the case of a thin wall thickness, the toughness is high, and the reactivity with the piezoelectric/electrostrictive layer 22 and the electrode material is small.

Those which are fully stabilized or partially stabilized as follows are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide, and magnesium oxide. When at least one compound of them is added and contained, the objective zirconia can be stabilized partially or fully. However, the objective zirconia can be stabilized as well, not only by adding one type of the compound but also by adding a combination of the compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on the film formation method is adopted as a technique for forming the piezoelectric/electrostrictive element 20a, 20b, it is also preferable to add, for example, alumina, magnesia, and transition metal oxide as an additive.

In order to obtain the mechanical strength and the stable crystal phase, it is desirable that the average crystal grain size of zirconia is 0.05 to 3 μm, preferably 0.05 to 1 μm. As described above, ceramics can be used for the thin plate section 12a, 12b in the same manner as in the fixation section 14. Preferably, it is advantageous to construct the thin plate sections 12a, 12b with a substantially identical material in view of the reliability of the joined portion and the strength of the piezoelectric/electrostrictive device 10, in order to reduce any complicated procedure of the production.

The piezoelectric/electrostrictive element 20a, 20b has at least the piezoelectric/electrostrictive layer 22 and the pair of electrodes 24, 26 for applying the electric field to the piezoelectric/electrostrictive layer 22. It is possible to use, for example, piezoelectric/electrostrictive elements 20a, 20b of the unimorph type and the bimorph type. However, those of the unimorph type combined with the thin plate section 12a, 12b are suitable for the piezoelectric/electrostrictive device 10 as described above, because they are excellent in stability of the generated displacement amount and they are advantageous to realize the light weight.

As shown in FIG. 1, the piezoelectric/electrostrictive element 20a, 20b is preferably formed on the side surface of the thin plate section 12a, 12b in view of the fact that the thin plate section 12a, 12b can be driven to a greater extent.

Piezoelectric ceramics is preferably used for the piezoelectric/electrostrictive layer 22. However, it is also possible to use electrostrictive ceramics, ferroelectric ceramics, or anti-ferroelectric ceramics. However, when the piezoelectric/electrostrictive device 10 is used, for example, to position the magnetic head of the hard disk drive, it is important to provide the linearity concerning the displacement amount of the object 18 and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with small reactivity with the thin plate sections 12a, 12b (ceramics) during the sintering of the piezoelectric/electrostrictive layer 22.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer 22. As a result, the composition is varied, and the piezoelectric characteristic is deteriorated.

On the other hand, it is preferable that the pair of electrodes 24, 26 of the piezoelectric/electrostrictive element 20a, 20b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 22 or the thin plate section 12a, 12b.

The material for the electrodes 24, 26 of the piezoelectric/electrostrictive element 20a, 20b is selected and determined depending on the method for forming the piezoelectric/electrostrictive layer 22. For example, when the piezoelectric/electrostrictive layer 22 is formed by sintering on the first electrode 24 after the first electrode 24 is formed on the thin plate section 12a, 12b, it is necessary for the first electrode 24 to use high melting point metal such as platinum, palladium, platinum-palladium alloy, and silver-palladium alloy which does not change at the sintering temperature for the piezoelectric/electrostrictive layer 22. However, the electrode formation can be performed at a low temperature for the second electrode 26 which is formed on the piezoelectric/electrostrictive layer 22 after forming the piezoelectric/electrostrictive layer 22. Therefore, it is possible for the second electrode 26 to use low melting point metal such as aluminum, gold, and silver.

The thickness of the electrode 24, 26 also serves as a factor to considerably decrease the displacement of the piezoelectric/electrostrictive element 20a, 20b. Therefore, it is preferable, especially for the electrode formed after the sintering of the piezoelectric/electrostrictive layer 22, to use organic metal paste capable of obtaining a dense and thinner film after the sintering, for example, a material such as gold resinate paste, platinum resinate paste, and silver resinate paste.

Further, for example, organic resin, brazing material, or solder may be used as the adhesive 36 for securing the object 18 to the object attachment surfaces 34a, 34b of the thin plate sections 12a, 12b. However, it is desirable to use organic resin when the object 18 is bonded at a low temperature. When the object 18 may be bonded at a high temperature, it is preferable to use, for example, brazing material, solder, and glass.

In the piezoelectric/electrostrictive device 10 according to the embodiment described above, it is desirable that the object 18 is an objective article which is to be controlled by actuator concerning, for example, the positional control and the prevention of vibration.

It is a matter of course that the piezoelectric/electrostrictive device according to the present invention is not limited to the embodiments described above, which may be embodied in other various forms without deviating from the gist or essential characteristics of the present invention.

What is claimed is:

1. A piezoelectric/electrostrictive device comprising:
   a pair of mutually opposing thin plate sections having respective object attachment surfaces that face one another and a fixation section for supporting said thin plate sections, said thin plate sections and said fixation section being formed with ceramics in an integrated manner;
   an object attached to said object attachment surfaces between forward end portions of said pair of thin plate sections; and
   one or more piezoelectric/electrostrictive elements arranged on at least one thin plate section of said pair of thin plate sections, wherein:
      an areal size of a surface of said object opposed to said thin plate sections is larger than an areal size of said object attachment surfaces of said thin plate sections.

2. The piezoelectric/electrostrictive device according to claim 1, wherein said piezoelectric/electrostrictive element has a film-shaped configuration, and is integrated with said thin plate section by means of sintering.

3. The piezoelectric/electrostrictive device according to claim 1, wherein said object is secured to said object attachment surface of said thin plate section by the aid of an adhesive.

4. The piezoelectric/electrostrictive device according to claim 3, wherein said adhesive is composed of an organic resin.

5. The piezoelectric/electrostrictive device according to claim 3, wherein said adhesive is composed of glass, braze, or solder.

6. The piezoelectric/electrostrictive device according to claim 1, wherein said respective object attachment surfaces lie in different planes that are parallel to one another, and an areal size of respective surfaces of said object opposed and attached to said thin plate sections is larger than an areal size of said respective object attachment surfaces of said thin plate sections.

* * * * *

UNITED STATES PATENT AND TRADEMARK OFFICE
CERTIFICATE OF CORRECTION

PATENT NO. : 6,525,448 B1
DATED : February 25, 2003
INVENTOR(S) : Yukihisa Takeuchi and Kazuyoshi Shibata It is certified that error appears in the above-identified patent and that said Letters Patent is hereby corrected as shown below:

<u>Title page,</u>
Item [76], Inventors,

Please delete: "Yukihisa Takeuchi, c/o NGK Insulators, Ltd. 2-56, Suda-Cho, Mizuho-ku, Nagoya-City, Aichi-Prefecture 467-8530 (JP); Kazuyoshi Shibata, c/o NGK Insulators, Ltd. 2-56, Suda-Cho, Mizuho-ku, Nagoya-City, Aichi-Prefecture 467-8530 (JP)"

and replace with: -- Yukihisa Takeuchi, Nishikamo-Gun (JP) and Kazuyoshi Shibata, Mizunami-City (JP) --

Please add Item:
-- [73] Assignee: NGK Insulators, Ltd., Nagoya (JP) --

Signed and Sealed this

Twelfth Day of August, 2003

JAMES E. ROGAN
*Director of the United States Patent and Trademark Office*